(12) United States Patent
Ching et al.

(10) Patent No.: US 9,870,949 B2
(45) Date of Patent: Jan. 16, 2018

(54) SEMICONDUCTOR DEVICE AND FORMATION THEREOF

(71) Applicant: Taiwan Semiconductor Manufacturing Company Limited, Hsin-Chu (TW)

(72) Inventors: Kuo-Cheng Ching, Zhubei (TW); Guan-Lin Chen, Baoshan Township (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 0 days.

(21) Appl. No.: 15/485,270

(22) Filed: Apr. 12, 2017

(65) Prior Publication Data

US 2017/0221765 A1 Aug. 3, 2017

Related U.S. Application Data

(60) Continuation of application No. 15/214,826, filed on Jul. 20, 2016, now Pat. No. 9,627,264, which is a division of application No. 14/461,502, filed on Aug. 18, 2014, now Pat. No. 9,406,778, which is a continuation-in-part of application No. 14/155,793, filed on Jan. 15, 2014, now Pat. No. 9,257,559.

(51) Int. Cl.
*H01L 21/8234* (2006.01)
*H01L 27/088* (2006.01)

(52) U.S. Cl.
CPC ........ *H01L 21/823431* (2013.01); *H01L 21/823468* (2013.01); *H01L 21/823481* (2013.01); *H01L 27/0886* (2013.01)

(58) Field of Classification Search
None
See application file for complete search history.

(56) References Cited

U.S. PATENT DOCUMENTS

| 7,939,406 B2 | 5/2011 | Grisham et al. |
| 8,901,607 B2 | 12/2014 | Wang et al. |
| 9,006,786 B2 | 4/2015 | Ching et al. |
| 2014/0197457 A1 | 7/2014 | Wang et al. |

*Primary Examiner* — Sonya D McCall Shepard
(74) *Attorney, Agent, or Firm* — Cooper Legal Group, LLC

(57) ABSTRACT

A semiconductor device and method of formation are provided herein. A semiconductor device includes a fin having a first wall extending along a first plane, the fin including a doped region defining a first furrow on a first side of the first plane. A dielectric is disposed within the first furrow, such that the dielectric is in contact with the first furrow between a first end of the dielectric and a second end of the dielectric. The first end is separated a first distance from the first plane. The dielectric disposed within the furrow increases the isolation of a channel portion of adjacent fins, and thus decreases current leakage of a FinFet, as compared to a FinFet including fins that do not include a dielectric disposed within a furrow.

20 Claims, 12 Drawing Sheets

SEMICONDUCTOR DEVICE AND FORMATION THEREOF

RELATED APPLICATIONS

This application is a continuation of and claims priority to U.S. patent application Ser. No. 15/214,826, titled "SEMICONDUCTIVE DEVICE AND FORMATION THEREOF" and filed Jul. 20, 2016, which is a divisional of U.S. patent application Ser. No. 14/461,502, titled "SEMICONDUCTIVE DEVICE AND FORMATION THEREOF" and filed Aug. 18, 2014, which is a continuation-in-part of U.S. patent application Ser. No. 14/155,793, titled "SEMICONDUCTOR DEVICE AND FORMATION THEREOF" and filed Jan. 15, 2014. U.S. patent application Ser. No. 14/155,793 is incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
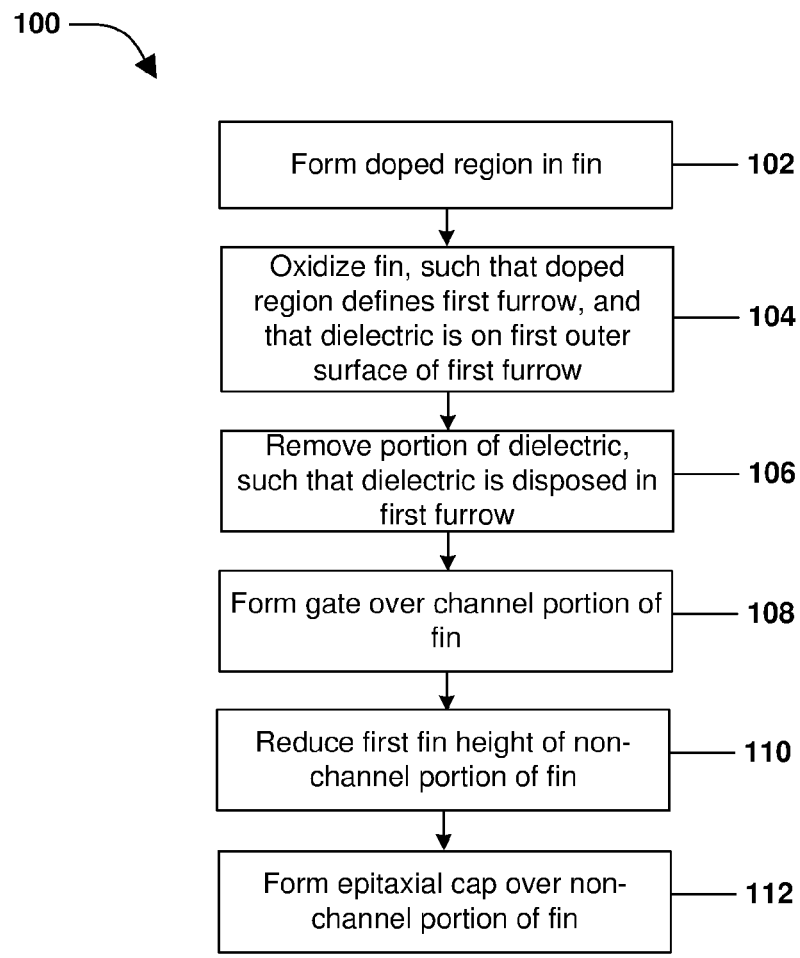
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 2:
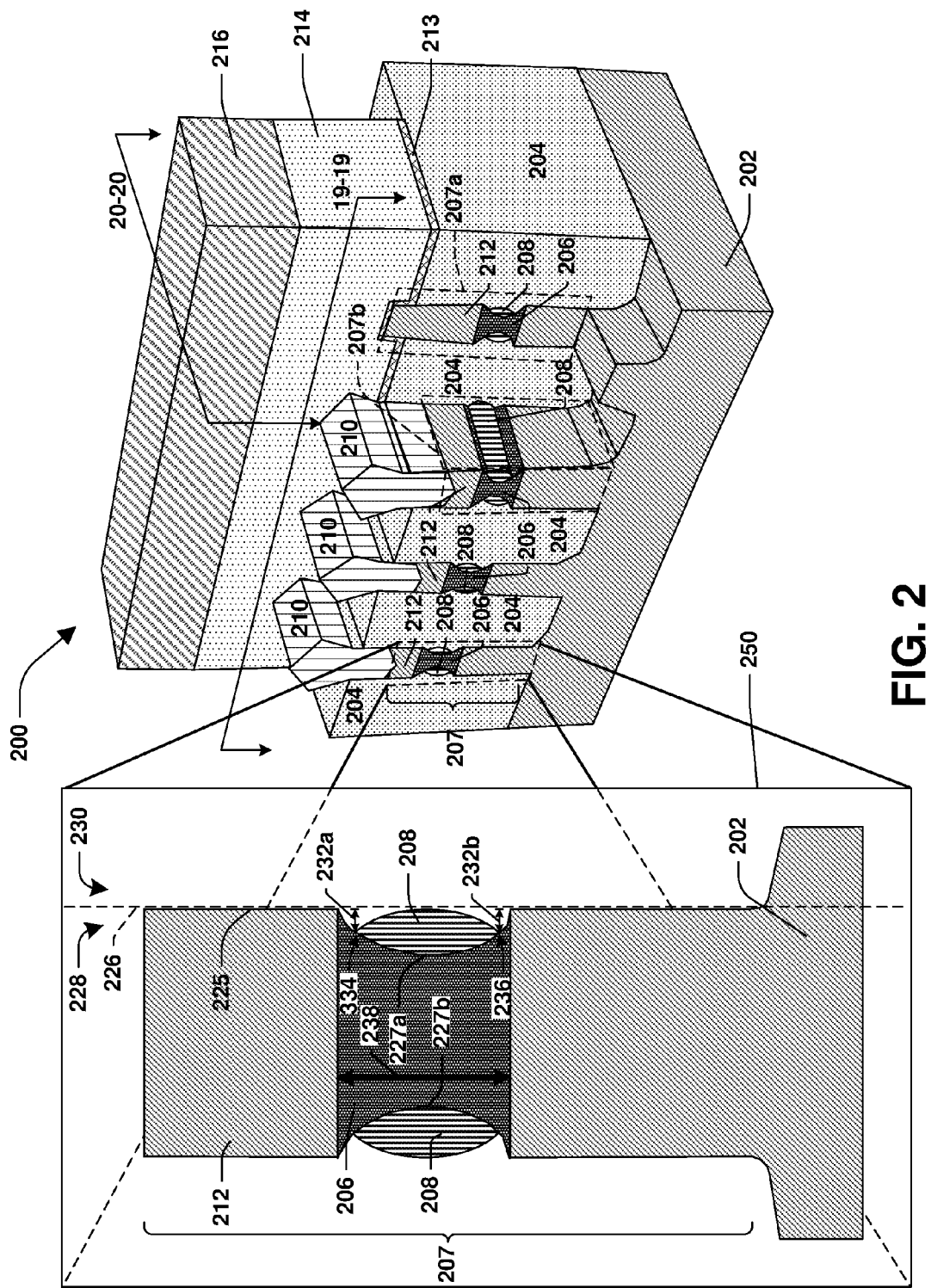
FIG. 2 is an illustration of a semiconductor device, in accordance with some embodiments.
Figure 19:
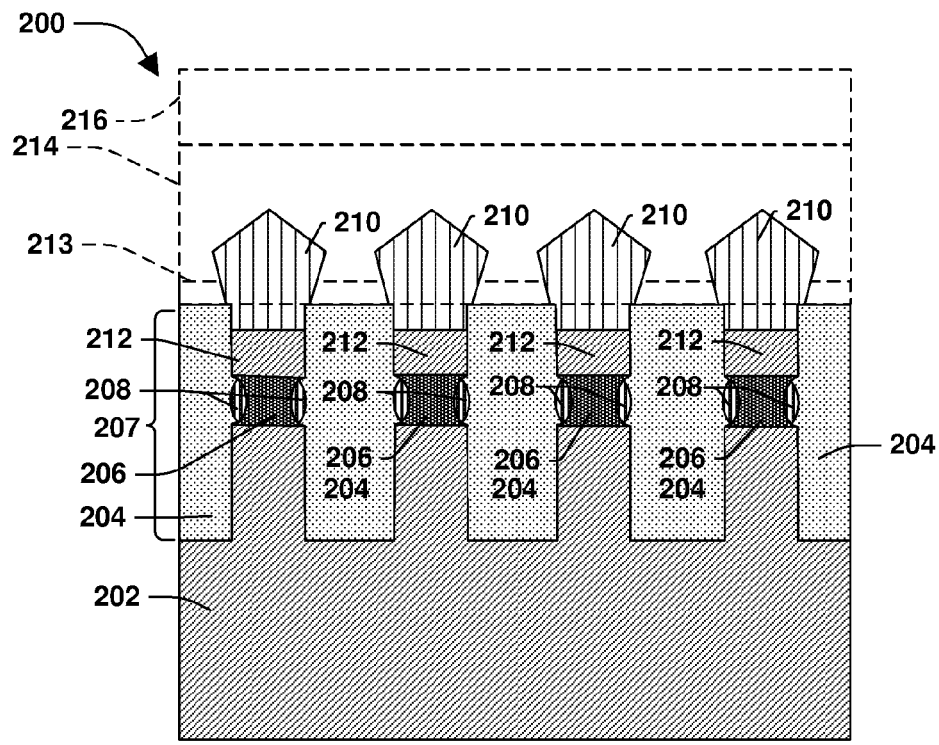
FIG. 19 is an illustration of a semiconductor device, in accordance with some embodiments.
Figure 20:
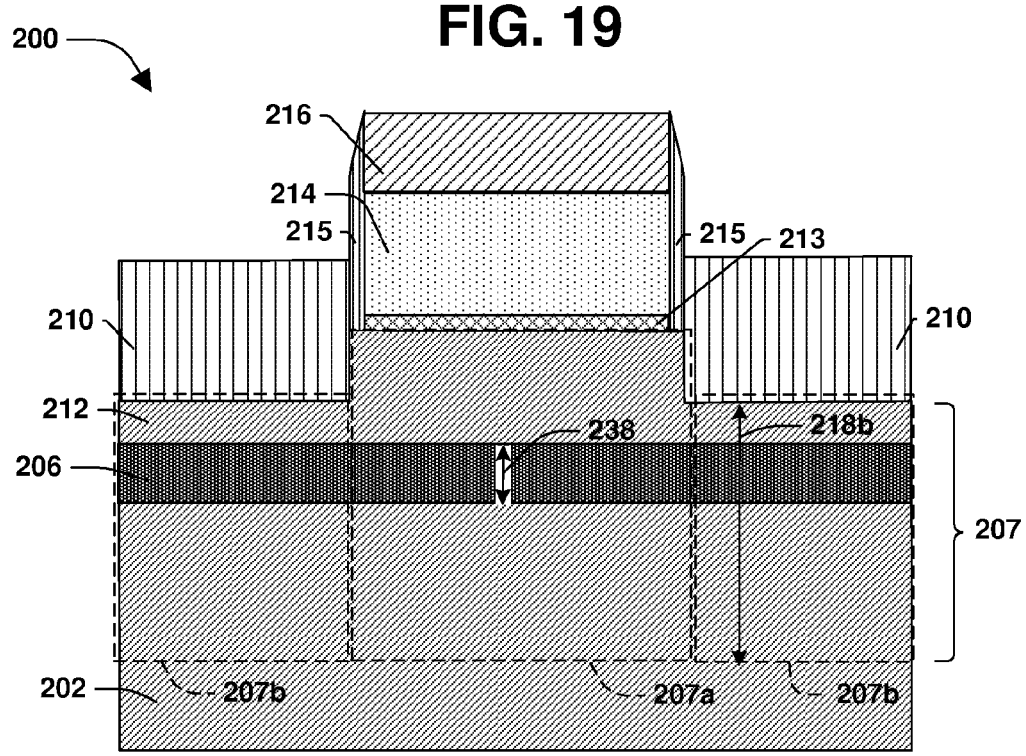
FIG. 20 is an illustration of a semiconductor device, in accordance with some embodiments.

A method 100 of forming a semiconductor device 200 according to some embodiments is illustrated in FIG. 1 and one or more structures formed thereby at various stages of fabrication are illustrated in FIGS. 2-20. According to some embodiments, such as illustrated in FIG. 2, which illustrates a 3D rendering of the semiconductor device 200 and a magnified fin 250, where sidewalls 215, as illustrated in FIGS. 16, 18 and 20 are not shown, so that features underlying the sidewalls 215 are visible. In some embodiments, the magnified fin 250 illustrates a magnified or zoomed in illustration of the fin 207 encompassed by a dashed box. In FIG. 2, a semiconductor device 200 comprises a fin 207, the fin 207 comprising a doped region 206 and a dielectric 208, according to some embodiments. In some embodiments, STI 204 is adjacent the fin 207, and an epitaxial (epi) cap 210 is over a non-channel portion 207b of the fin 207. In some embodiments, a gate dielectric layer 213 is formed over a channel portion 207a of the fin 207. In some embodiments, a gate 214 is formed over the gate dielectric layer 213, and a hard mask 216 is formed over the gate 214. In some embodiments, such as shown in the magnified fin 250, the fin 207 has a first wall 225 extending along a first plane 226. In some embodiments, the doped region 206 defines a first furrow 227a on a first side 228 of the first plane 226. In some embodiments, the dielectric 208 is disposed within the first furrow 227a such that the dielectric 208 is in contact with the first furrow 227a between a first end 234 of the dielectric 208 and a second end 236 of the dielectric 208. In some embodiments, the first end 234 is separated a first distance 232a from the first plane 226. In some embodiments, the second end 236 is separated a second distance 232b from the first plane 226, the second distance 232b substantially equal to the first distance 232a. In some embodiments, the configuration of the dielectric 208 over the doped region 206 inhibits current leakage between adjacent fins 207. In FIG. 2 a line 19-19 is drawn to illustrate a cross-section that is depicted in FIG. 19, according to some embodiments. In FIG. 2 a line 20-20 is drawn to illustrate a cross-section that is depicted in FIG. 20, according to some embodiments. In some embodiments, the line 19-19, cuts through the epi caps 210 and the non-channel portion 207b of the fin 207. FIGS. 3, 5, 7, 10, 13, 15, 17 and 19 are cross sectional views of the semiconductor device 200 taken along the line 19-19 at various stages of fabrication. In some embodiments, the line 20-20, cuts through the hard mask 216, the gate 214, the gate dielectric layer 213, the epi cap 210, the non-channel portion 207b of the fin 207, and the channel portion 207a of the fin. FIGS. 4, 6, 8, 11, 14, 16, 18 and 20 are cross sectional views of the semiconductor device 200 taken along the line 19-19 at various stages of fabrication.

Figure 3:
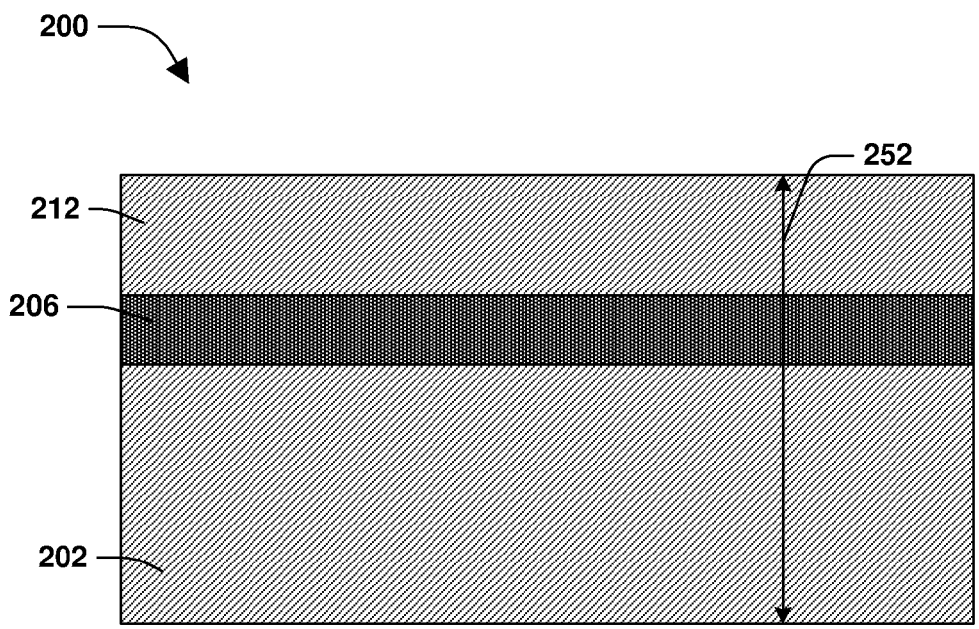
FIG. 3 is an illustration of a semiconductor device, in accordance with some embodiments.
Figure 4:
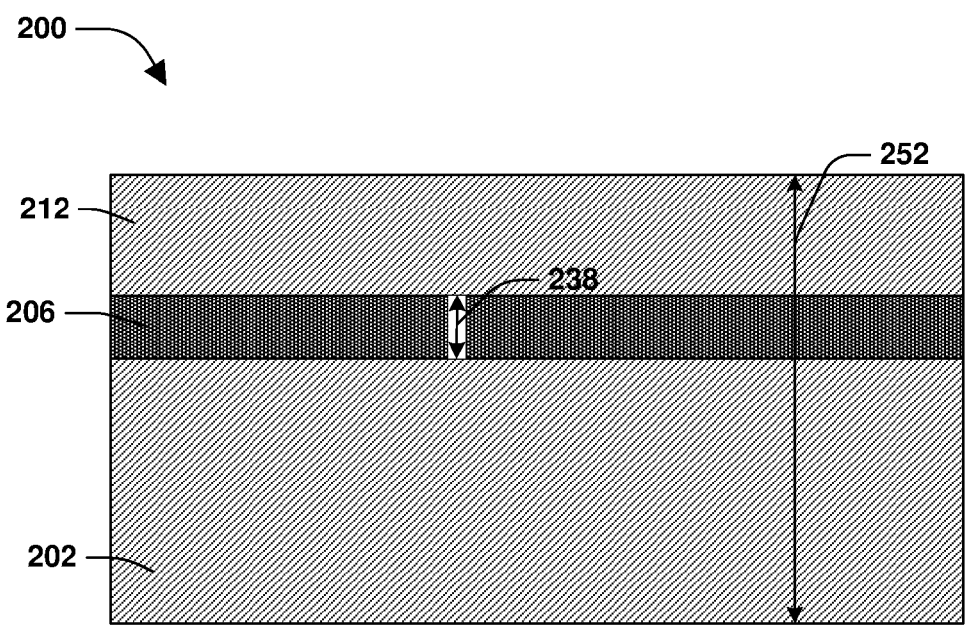
FIG. 4 is an illustration of a semiconductor device, in accordance with some embodiments.
Figure 5:
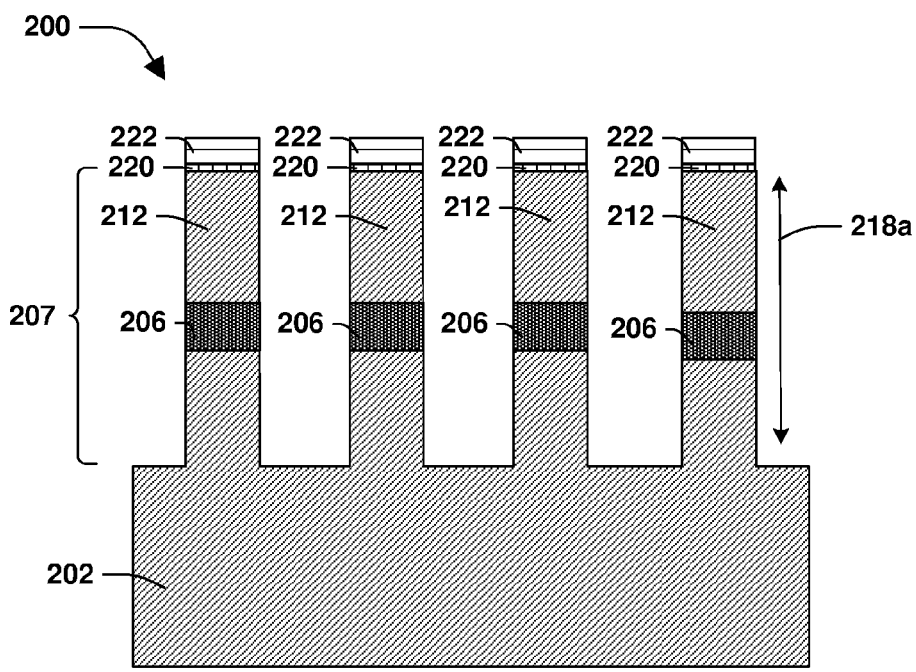
FIG. 5 is an illustration of a semiconductor device, in accordance with some embodiments.
Figure 6:
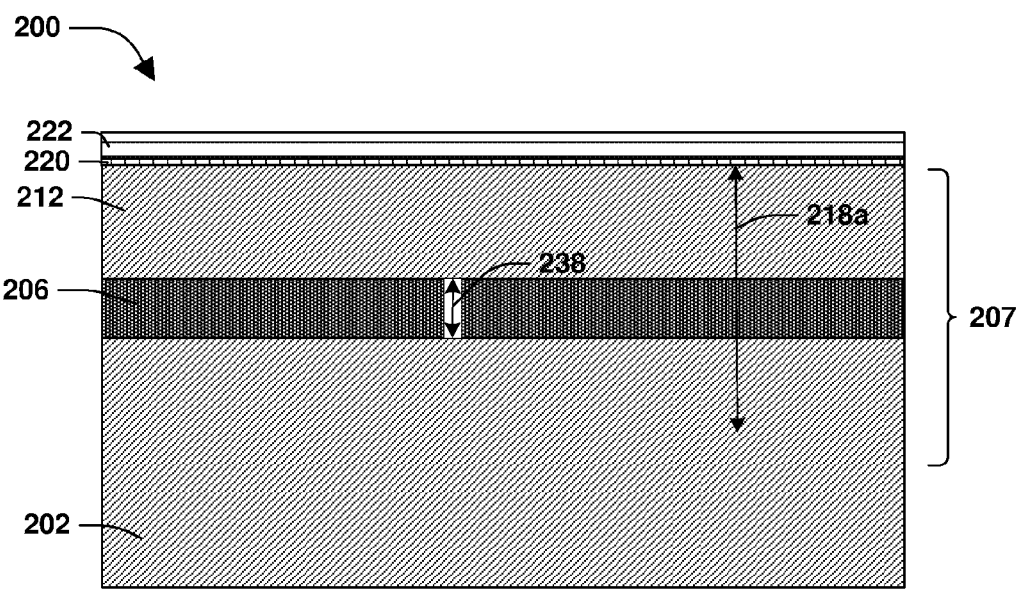
FIG. 6 is an illustration of a semiconductor device, in accordance with some embodiments.

At 102, the doped region 206 is formed in the fin 207, as illustrated in FIGS. 5-6, according to some embodiments. Turning to FIGS. 3-4, prior to FIGS. 5-6, a doped region 206 is formed over a substrate 202, according to some embodiments. In some embodiments, the substrate 202 comprises silicon. According to some embodiments, the substrate 202 comprises at least one of an epitaxial layer, a silicon-on-insulator (SOI) structure, a wafer, or a die formed from a wafer. In some embodiments, the substrate 202 comprises at least one of a first conductivity type or a second conductivity type. In some embodiments, the first conductivity type is at least one of a p-type or an n-type. In some embodiments, the second conductivity type is p-type if the first conductivity type is n-type and the second conductivity type is n-type if the first conductivity type is p-type. In some embodiments, the doped region 206 is grown. In some embodiments, the doped region 206 has a doped region height 238 between about 25 nm to about 45 nm. In some embodiments, the doped region 206 comprises at least one of silicon or germanium. In some embodiments, a second substrate layer 212 is formed over the doped region 206. In some embodiments, the second substrate layer 212 comprises silicon. In some embodiments, the second substrate layer 212 is formed by at least one of growth or deposition. In some embodiments, the second substrate layer 212 comprises at least one of the first conductivity type or the second conductivity type. In some embodiments, the second substrate layer 212 has a second substrate height between about 40 nm to about 100 nm. In some embodiments, a stack height 252 of the substrate 202, the doped region 206 and the second substrate layer 212 is between about 200 nm to about 500 nm. In some embodiments, a mask layer 220 is formed over the second substrate layer 212, as illustrated in FIGS. 5-6. In some embodiments, the mask layer 220 comprises an oxide. In some embodiments, the mask layer 220 has a thickness between about 1 nm to about 6 nm. In some embodiments, a fin hard mask 222 is formed over the mask layer 220. In some embodiments, the fin hard mask 222 comprises nitride. In some embodiments, the fin hard mask 222 has a thickness between about 15 nm to about 25 nm. In some embodiments, the fin 207 or multiple fins are formed, such as by etching, as illustrated in FIG. 5, where the fin hard mask 222 and the mask layer 220 are patterned to protect or define the fin during the etching. In some embodiments, the fin 207 has a first fin height 218a between about 140 nm to about 260 nm.

Figure 7:
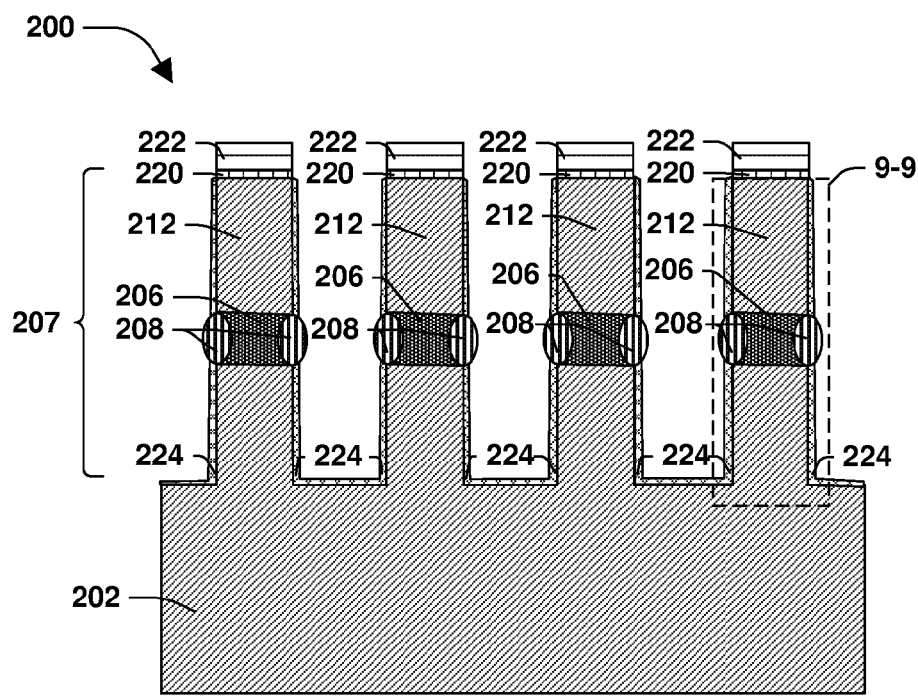
FIG. 7 is an illustration of a semiconductor device, in accordance with some embodiments.
Figure 8:
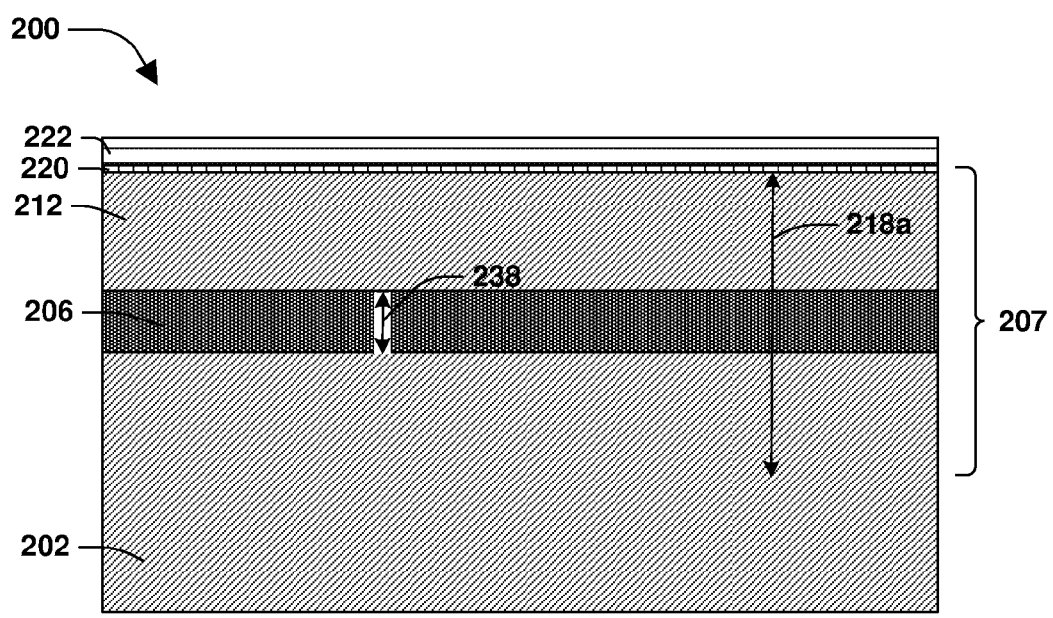
FIG. 8 is an illustration of a semiconductor device, in accordance with some embodiments.
Figure 9:
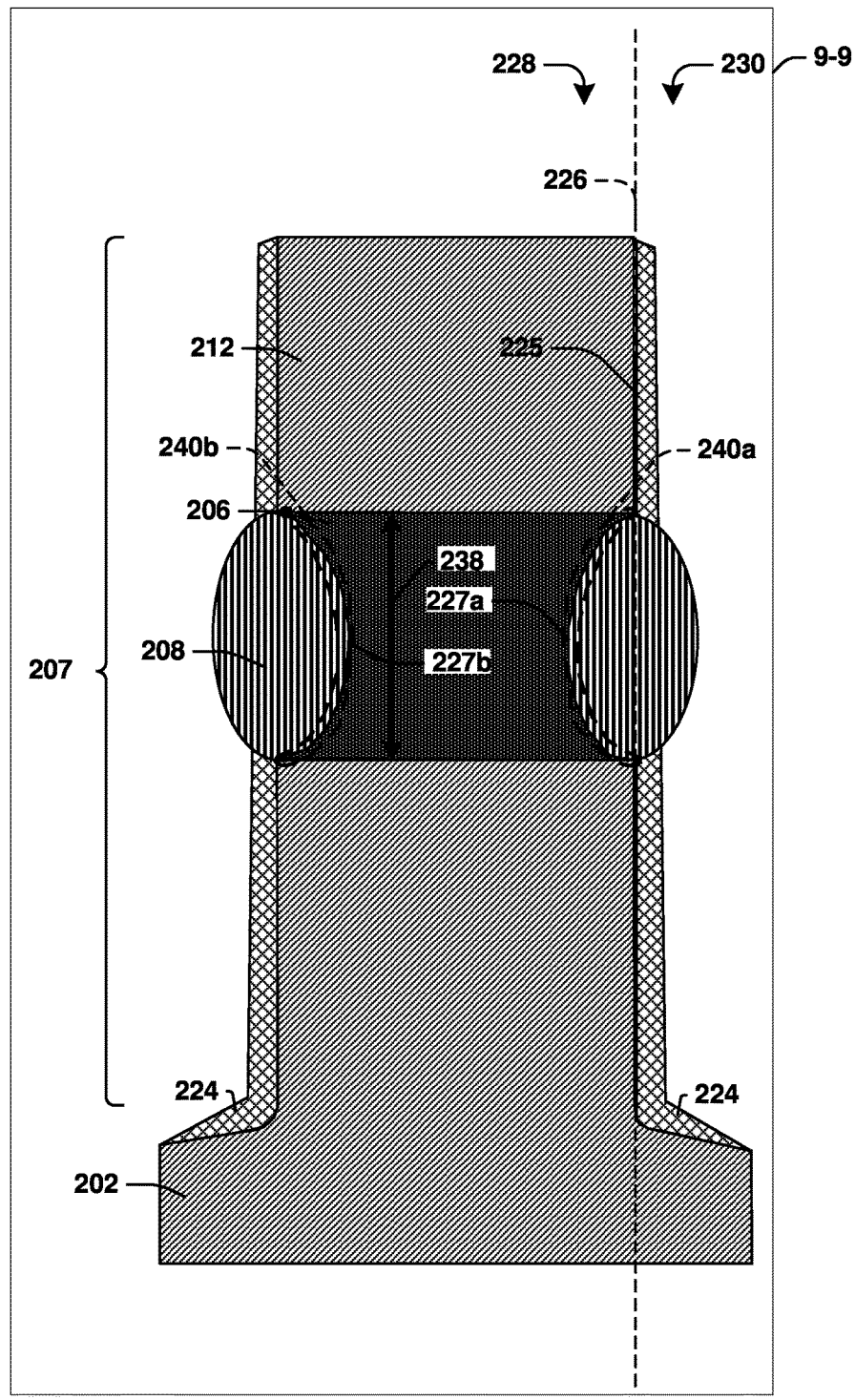
FIG. 9 is an illustration of a semiconductor device, in accordance with some embodiments.

At 104, the fin 207 is oxidized, such that the doped region 206 defines the first furrow 227a and that the dielectric 208 is on a first outer surface 240a of the first furrow 227a, as illustrated in FIG. 9, which illustrates a magnified fin, the magnified fin illustrates a magnified or zoomed in illustration of the fin 207 encompassed by the dashed box 9-9 illustrated in FIG. 7. In some embodiments, the fin 207 is oxidized, such that the doped region 206 defines a second furrow 227b and such that the dielectric 208 is on a second outer surface 240b of the second furrow 227b. In some embodiments, the fin 207 is oxidized, such as by thermal oxidation. In some embodiments, thermal oxidation comprises applying $H_2O$ gas at a temperature between about 500° C. to about 1000° C. to the semiconductor device 200. In some embodiments, such as illustrated in FIGS. 7 and 9, a surface of the substrate 202 and a surface of the second substrate layer 212 are oxidized such that an oxidation layer 224 comprising silicon and oxide is on the surface of the substrate 202 and the surface of the second substrate layer 212. In some embodiments, the oxidation layer 224 has a thickness between about 0.5 nm to about 3 nm. In some embodiments, the dielectric 208 comprises oxide and at least one of silicon or germanium. In some embodiments, the dielectric 208 is convex and extends from the first furrow 227a such that the dielectric 208 extends to a second side 230 of the first plane 226, as illustrated in FIG. 9. In some embodiments, convex means a configuration comprising an external angle greater than about 180°.

Figure 10:
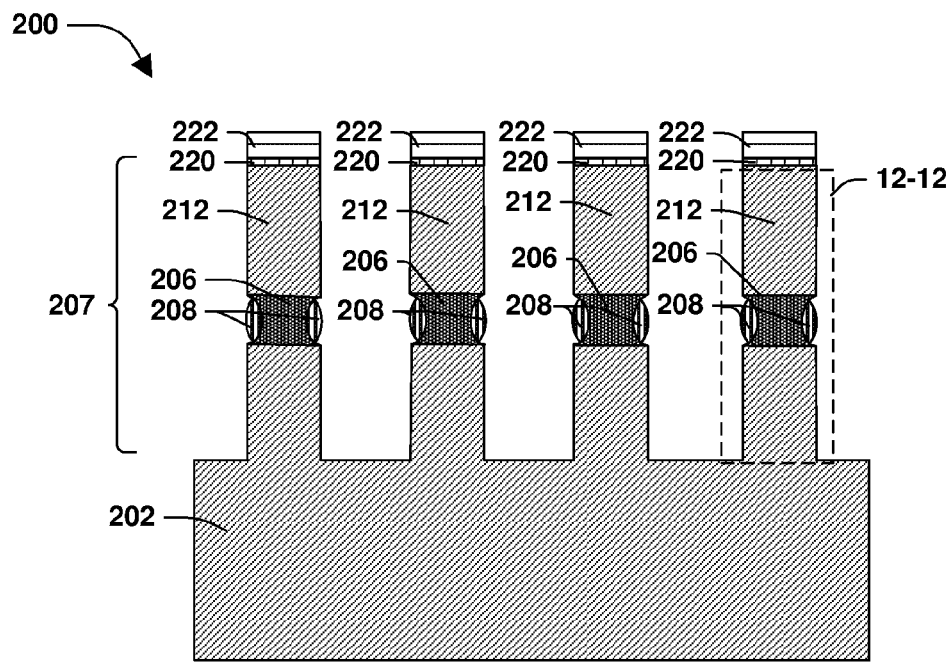
FIG. 10 is an illustration of a semiconductor device, in accordance with some embodiments.
Figure 11:
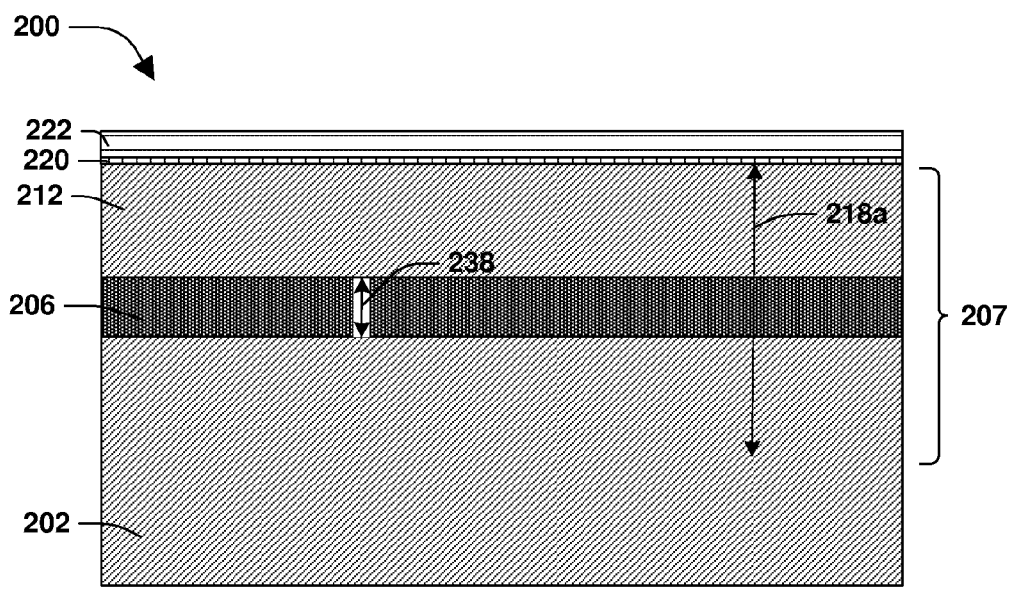
FIG. 11 is an illustration of a semiconductor device, in accordance with some embodiments.
Figure 12:
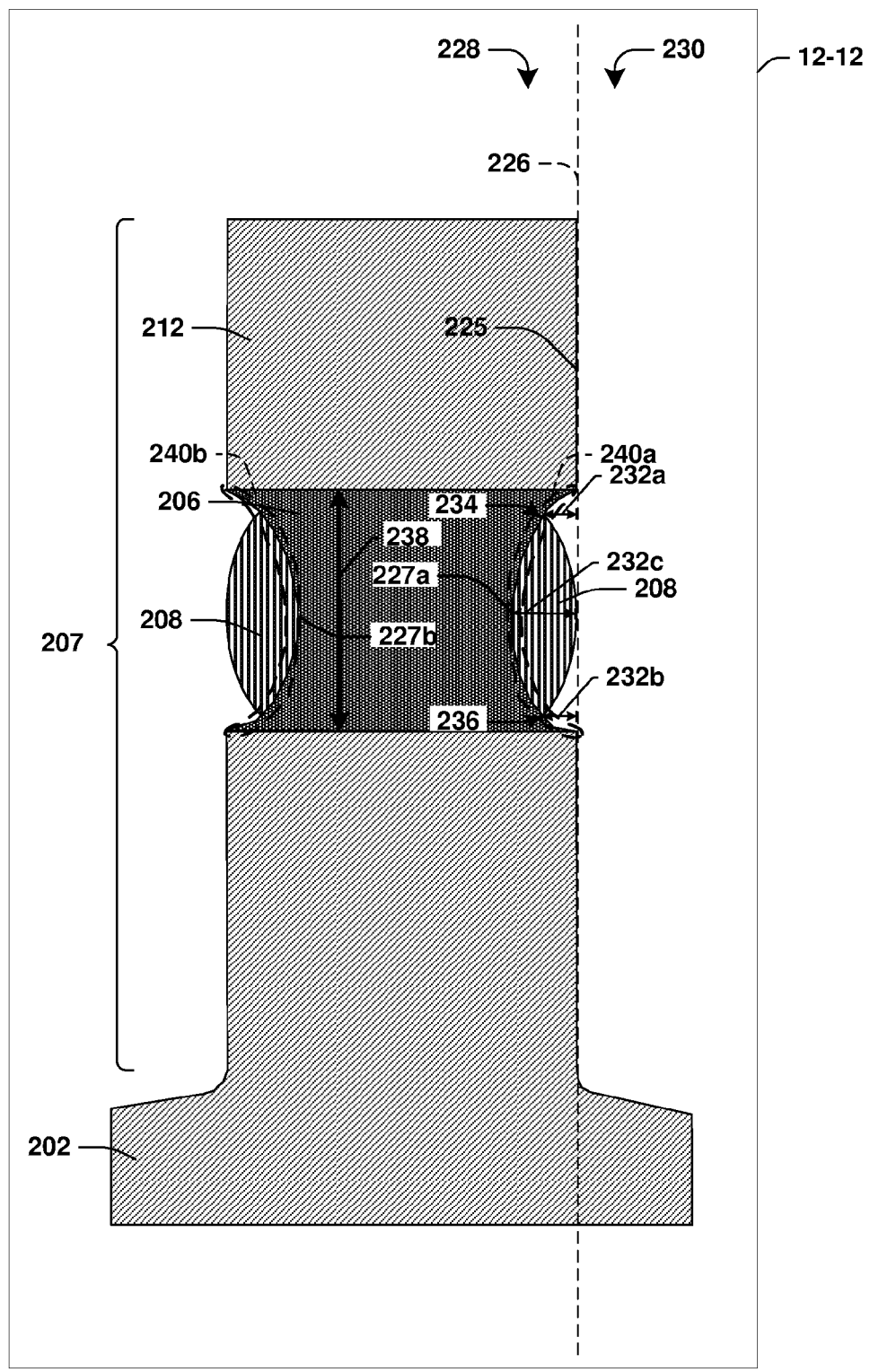
FIG. 12 is an illustration of a semiconductor device, in accordance with some embodiments.
Figure 13:
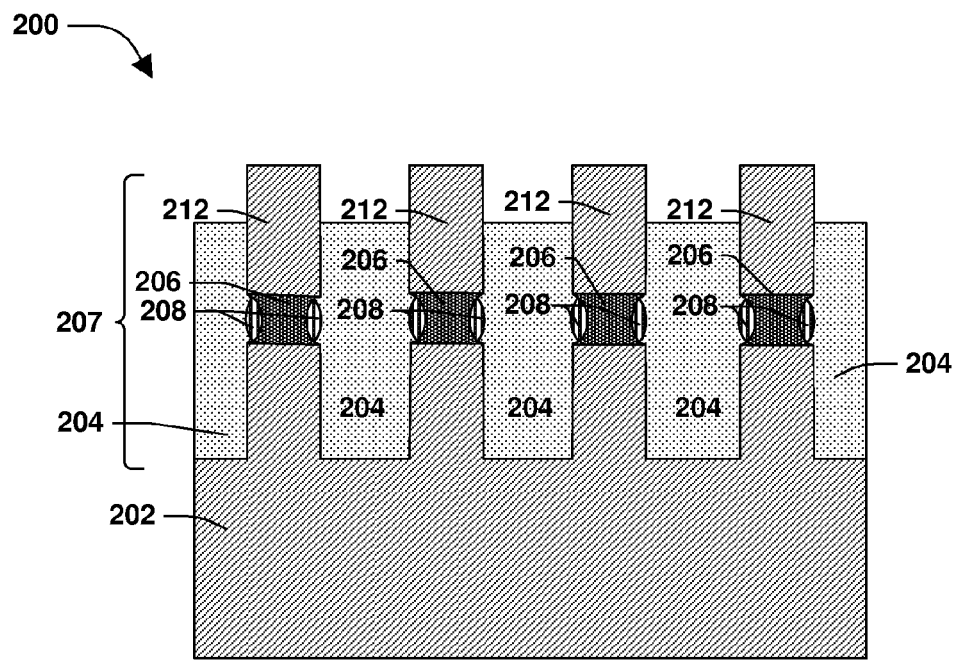
FIG. 13 is an illustration of a semiconductor device, in accordance with some embodiments.
Figure 14:
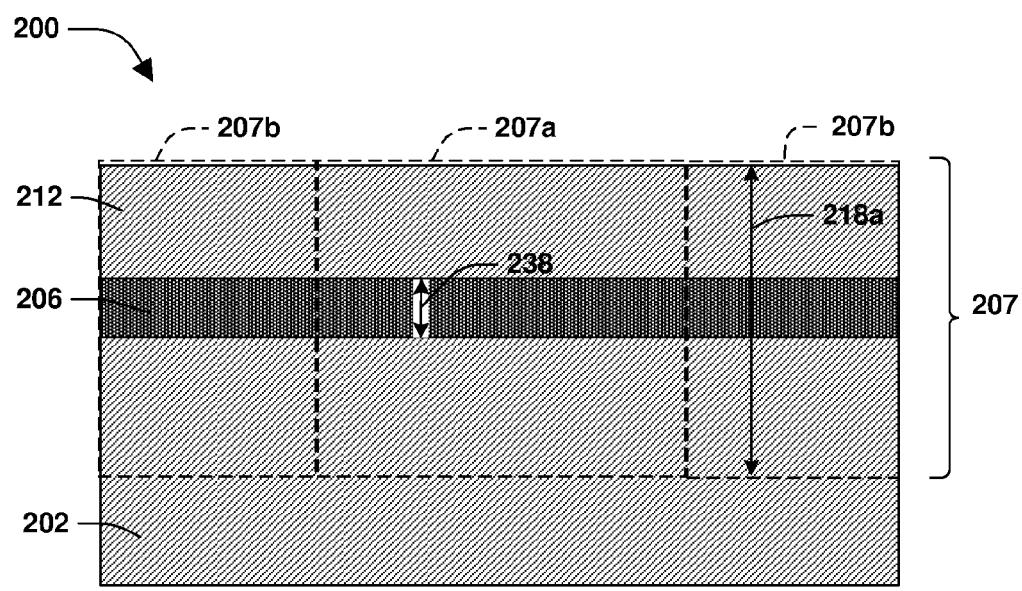
FIG. 14 is an illustration of a semiconductor device, in accordance with some embodiments.

At 106, a portion of the dielectric 208 is removed, such that the dielectric 208 is disposed in the first furrow 227a as illustrated in FIG. 12, which illustrates a magnified fin, the magnified fin illustrates a magnified or zoomed in illustration of the fin 207 encompassed by the dashed box 12-12 illustrated in FIG. 10. In some embodiments, the portion of dielectric 208 is removed by etching. In some embodiments, the dielectric 208 is disposed within the first furrow 227a such that the dielectric 208 is in contact with the first furrow 227a between a first end 234 of the dielectric 208 and a second end 236 of the dielectric 208. In some embodiments, the removal of the portion of the dielectric 208 exposes at least a portion of a first outer surface 240a. In some embodiments, the first end 234 is separated the first distance 232a from the first plane 226. In some embodiments, the second end 236 is separated the second distance 232b from the first plane 226. In some embodiments, the first distance 232a and the second distance 232b are substantially equal. In some embodiments, the first distance 232a is between about 0.5 nm to about 10 nm. In some embodiments, the dielectric 208 is convex, such that an outer most protruding point is at least one of even with the first plane 226, on the first side 228 of the first plane 226 or on a second side 230 of the first plane 226. In some embodiments, the dielectric 208 has a dielectric thickness 232c, the dielectric thickness 232c measured from a portion of the first furrow 227a nearest the second furrow 227b to the outer most protruding point of the dielectric 208. In some embodiments, the dielectric thickness 232c is between about 0.5 nm to about 10 nm. In some embodiments, the dielectric 208 is disposed in a second furrow 227b in substantially the same manner as the dielectric 208 is disposed in the first furrow 227a. In some embodiments, the oxidation layer 224 is removed, such as by etching, from the surface of the substrate 202 and from the surface of the second substrate layer 212, as illustrated in FIGS. 10 and 12. In some embodiments, the fin hard mask 222 and the mask layer 220 are removed, such as by etching after the oxidation layer 224 is removed, as illustrated in FIGS. 13-14. In some embodiments, STI 204 is formed between and over the fin 207, such that the STI 204 is on the surface of the substrate 202, the surface of the doped region 206 such as a portion of the furrow 227, a surface of the dielectric 208, and the surface of the second substrate layer 212. In some embodiments, the STI 204 comprises a high dielectric constant material, such as oxide. In some embodiments, the STI 204 is deposited, such as by deposition in a furnace. In some embodiments, the STI 204 is recessed, such as by a chemical etch comprising fluorine. In some embodiments, the STI 204 is recessed such that at least a top surface of the second substrate layer 212 is exposed.

Figure 15:
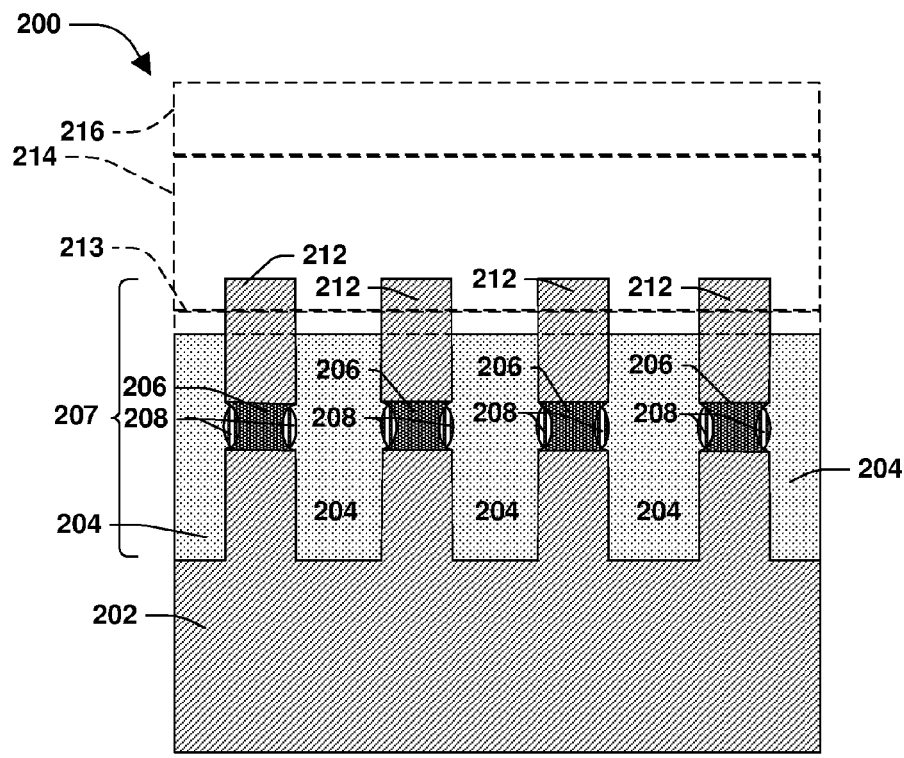
FIG. 15 is an illustration of a semiconductor device, in accordance with some embodiments.
Figure 16:
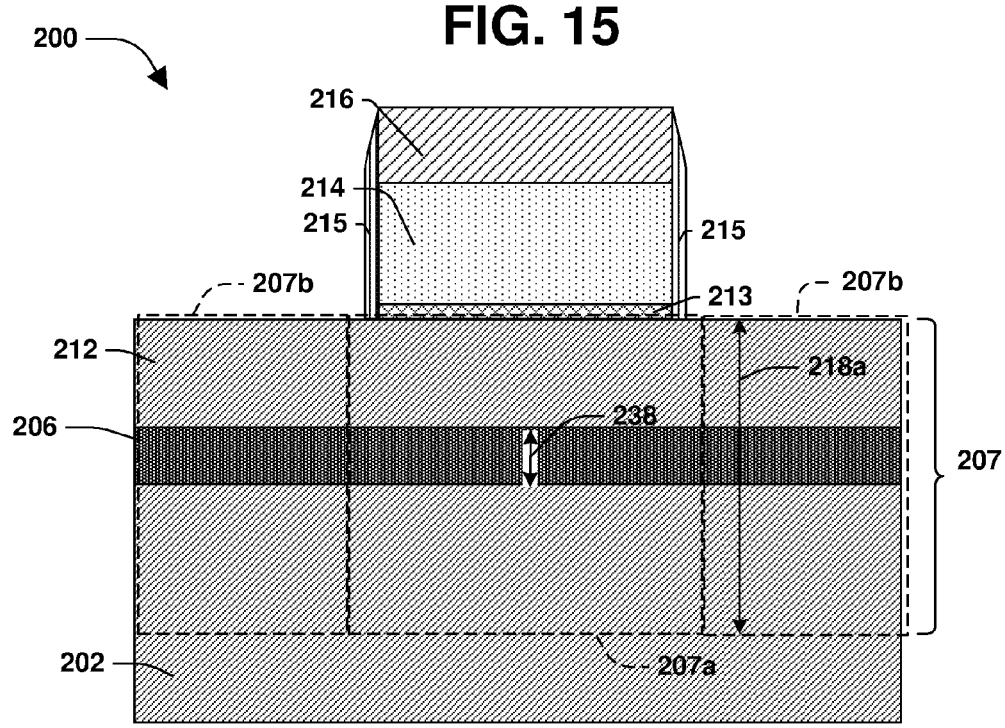
FIG. 16 is an illustration of a semiconductor device, in accordance with some embodiments.

At 108, a gate 214 is formed over the channel portion 207a of the fin 207, as illustrated in FIGS. 15-16, according to some embodiments. In some embodiments, forming the gate 214 comprises forming, such as by deposition, a gate dielectric layer 213 over the fin 207. In some embodiments, the gate dielectric layer 213 comprises a high dielectric constant material. In some embodiments, a gate material is deposited over the gate dielectric layer 213. In some embodiments, the gate material comprises a conductive material, such as metal or polysilicon. In some embodiments, a hard mask 216 is formed over the gate material, such that the hard mask 216 is over the portion of the gate material on the channel portion 207a of the fin 207. In some embodiments, the hard mask 216 comprises oxide. In some embodiments, the gate material and the gate dielectric layer 213 are patterned such that a gate 214 is formed over the channel portion 207a of the fin 207, as illustrated in FIG. 16. In some embodiments, sidewalls 215 are formed on a first side of the gate dielectric layer 213 and the gate 214 and on a second side of the gate dielectric layer 213 and the gate 214.

Figure 17:
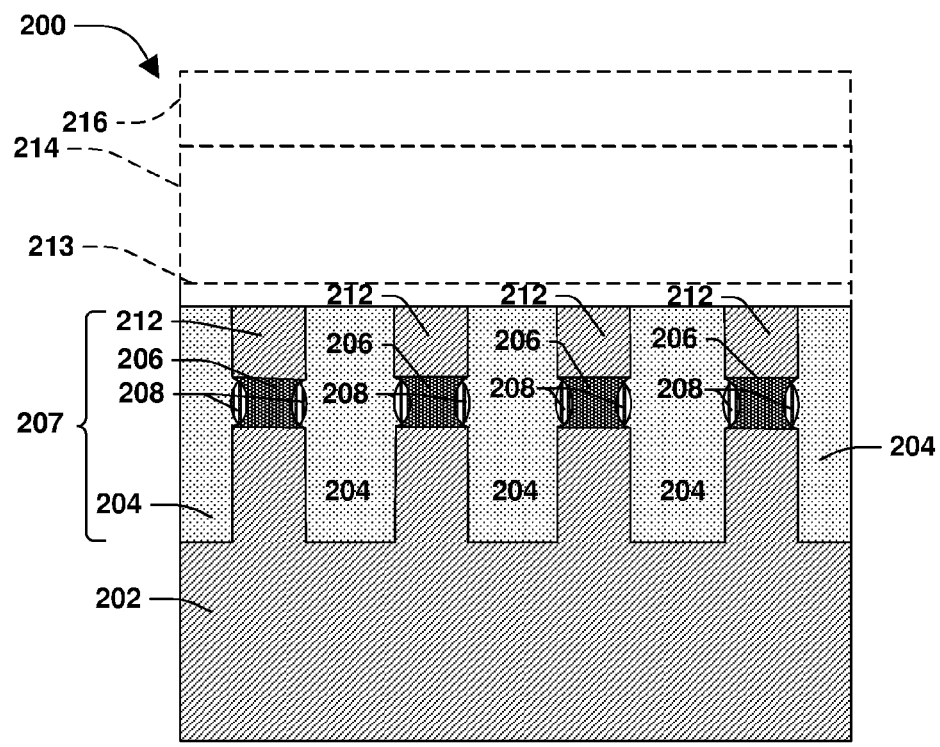
FIG. 17 is an illustration of a semiconductor device, in accordance with some embodiments.
Figure 18:
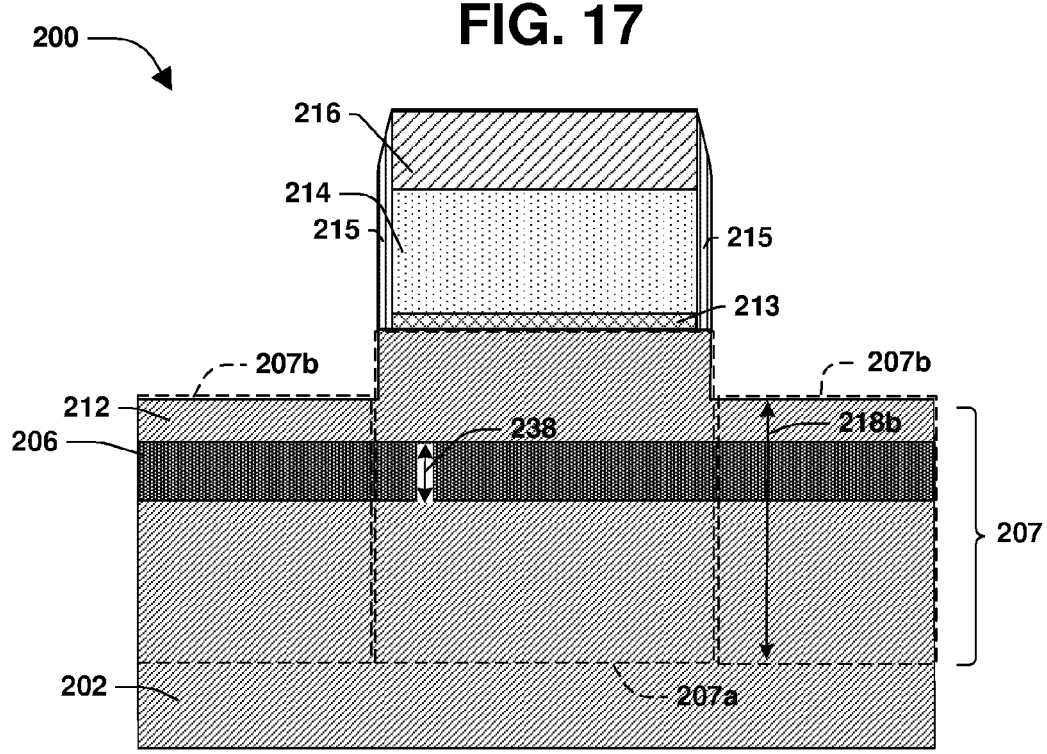
FIG. 18 is an illustration of a semiconductor device, in accordance with some embodiments.

At 110, the first fin height 218a of the non-channel portion 207b of the fin 207 is reduced, as illustrated in FIGS. 17-18, according to some embodiments. In some embodiments, a second fin height 218b of the non-channel portion 207b of the fin 207 is between about 80 nm to about 200 nm. In some embodiments, the first fin height 218a of the non-channel portion 207b of the fin 207 is reduced by etching, such as dry etching. In some embodiments, the first fin height 218a of the non-channel portion 207b of the fin 207 is reduced such that the non-channel portion 207b of the fin 207 is at least one of below a top surface of the STI 204, even with the top surface of the STI 204, or above the top surface of the STI 204.

At 112, the epi cap 210 is formed over the non-channel portion 207b of the fin 207, such as illustrated in FIGS. 19-20, according to some embodiments. In some embodiments, the epi cap 210 is adjacent the gate 214. In some embodiments, the epi cap 210 is grown, such as by epitaxial growth. In some embodiments, the epi cap 210 comprises at least one of a source or a drain. In some embodiments, the epi cap 210 comprises at least one of silicon or germanium. In some embodiments, the epi cap 210 comprises at least one of the first conductivity type or the second conductivity type. In some embodiments, the epi cap 210 has an epi cap height measured from a top most portion of the epi cap 210 to a top surface of the fin 207. In some embodiments, the epi cap height is between about 20 nm to about 50 nm. In some embodiments, the dielectric 208 disposed within the furrow 227 increases isolation of the channel portion 207a of adjacent fins 207, and thus decreases current leakage of a FinFet, as compared to a FinFet comprising fins that do not comprise the dielectric disposed within a furrow.

According to some embodiments, a semiconductor device comprises a fin having a first wall extending along a first plane. In some embodiments, the fin comprises a doped region, the doped region defining a first furrow on a first side of the first plane and a dielectric disposed within the first furrow. In some embodiments, the dielectric is in contact with the first furrow between a first end of the dielectric and a second end of the dielectric, the first end separated a first distance from the first plane.

According to some embodiments, a method of forming a semiconductor device comprises forming a doped region in a fin, the fin having a first wall extending along a first plane, and oxidizing the fin, such that the doped region defines a first furrow on a first side of the first plane, and such that a dielectric is on a first outer surface of the first furrow. In some embodiments, the method of forming a semiconductor device further comprises removing a portion of the dielectric, such that the dielectric is disposed within the first furrow and such that the dielectric is in contact with the first furrow between a first end of the dielectric and a second end of the dielectric. In some embodiments, the first end is separated a first distance from the first plane.

According to some embodiments, a semiconductor device comprises a fin comprising silicon having a first wall extending along a first plane. In some embodiments, the fin comprises a doped region comprising germanium, the doped region defining a first furrow on a first side of the first plane, and a dielectric disposed within the first furrow, the dielectric comprising silicon, germanium and oxygen. In some embodiments, the dielectric is in contact with the first furrow between a first end of the dielectric and a second end of the dielectric. In some embodiments, the first end is separated a first distance from the first plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
   forming a doped region in a fin,
   oxidizing the fin to form a dielectric feature on an outer surface of the doped region and an oxidation layer along a sidewall of the fin;
   removing the oxidation layer and a portion of the dielectric feature; and
   forming a shallow trench isolation feature adjacent the dielectric feature and the sidewall of the fin to conceal the dielectric feature.

2. The method of claim 1, wherein the forming a doped region comprises:
   forming a silicon germanium layer over a first substrate, wherein the silicon germanium layer defines the doped region;
   forming a second substrate over the silicon germanium layer; and
   removing a portion of the second substrate, a portion of the silicon germanium layer, and a portion of the first substrate to define the fin.

3. The method of claim 2, wherein the removing a portion of the silicon germanium layer exposes the outer surface of the doped region.

4. The method of claim 1, wherein, after the oxidizing, the doped region defines a concave surface that interfaces with the dielectric feature.

5. The method of claim 4, wherein the removing a portion of the dielectric feature comprises:
   exposing a portion of the concave surface.

6. The method of claim 5, wherein the forming a shallow trench isolation feature comprises:
   forming the shallow trench isolation feature to contact the portion of the concave surface that is exposed.

7. The method of claim 1, comprising:
   forming a gate dielectric over the fin and the shallow trench isolation feature.

8. The method of claim 7, comprising:
   forming a gate electrode over the gate dielectric; and
   forming sidewall spacers adjacent the gate electrode.

9. The method of claim 1, comprising:
   forming a gate over the fin and the shallow trench isolation feature; and
   removing some of the fin that is not concealed by the gate to expose a sidewall of a portion of the fin underlying the gate.

10. The method of claim 9, comprising:
    growing an epitaxial cap over a second portion of the fin and adjacent the sidewall of the portion of the fin underlying the gate.

11. The method of claim 1, wherein the dielectric feature defines a convex outer surface.

12. The method of claim 1, wherein the doped region comprises silicon germanium and the dielectric feature comprises silicon germanium oxide.

13. A method of forming a semiconductor device, comprising:
    forming a doped region between a first substrate and a second substrate;
    etching the first substrate, the doped region, and the second substrate to define a fin;
    oxidizing the fin to form a dielectric feature on an outer surface of the doped region;
    etching the dielectric feature to reduce a thickness of the dielectric feature; and
    forming a shallow trench isolation feature adjacent the dielectric feature and the fin.

14. The method of claim 13, wherein, after the oxidizing, the doped region defines a concave surface that interfaces with the dielectric feature.

15. The method of claim 14, wherein the etching the dielectric feature comprises:
    exposing a portion of the concave surface.

16. The method of claim 15, wherein the forming a shallow trench isolation feature comprises:
    forming the shallow trench isolation feature to contact the portion of the concave surface that is exposed.

17. The method of claim 13, wherein:
    a sidewall of the fin lies in a first plane,
    an outer most protruding point of the dielectric feature lies in a second plane parallel to the first plane prior to the etching,
    the outer most protruding point of the dielectric feature lies in a third plane parallel to the first plane after the etching, and the first plane is between the second plane and the third plane.

18. The method of claim 13, comprising:
forming a gate over the fin and the shallow trench isolation feature; and
removing some of the fin that is not concealed by the gate to define a portion of the fin having a reduced height.

19. The method of claim 18, comprising:
growing an epitaxial cap over the portion of the fin having the reduced height.

20. A method of forming a semiconductor device comprising:
forming a doped region in a fin, wherein the fin has a first wall extending along a plane and the fin is disposed on a first side of the plane but not on a second side of the plane;
oxidizing the fin to form a dielectric feature from at least some of the doped region; and
removing a portion of the dielectric feature such that the dielectric feature is convex, wherein:
a first end of the dielectric feature is disposed on the first side of the plane and is separated a first distance from the plane, and
an outer most protruding point of the dielectric feature is disposed between the first end and a second end of the dielectric feature.

* * * * *